(12) United States Patent
Yamashita

(10) Patent No.: US 11,556,054 B2
(45) Date of Patent: Jan. 17, 2023

(54) FORMING APPARATUS, DETERMINATION METHOD, AND ARTICLE MANUFACTURING METHOD

(71) Applicant: CANON KABUSHIKI KAISHA, Tokyo (JP)

(72) Inventor: Keiji Yamashita, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/844,193

(22) Filed: Apr. 9, 2020

(65) Prior Publication Data

US 2020/0341368 A1 Oct. 29, 2020

(30) Foreign Application Priority Data

Apr. 24, 2019 (JP) .............................. JP2019-083209

(51) Int. Cl.
*G03F 7/00* (2006.01)
*B29C 33/42* (2006.01)

(52) U.S. Cl.
CPC .......... *G03F 7/0002* (2013.01); *B29C 33/424* (2013.01); *B29C 2033/426* (2013.01)

(58) Field of Classification Search
CPC ............. B29C 33/424; B29C 2033/426; G03F 7/0002
See application file for complete search history.

(56) References Cited

U.S. PATENT DOCUMENTS

| 10,468,247 | B2 | 11/2019 | Fletcher | |
| 2004/0233373 | A1* | 11/2004 | Ogimoto | G02F 1/1341 349/153 |
| 2010/0193994 | A1* | 8/2010 | Wuister | B82Y 10/00 264/293 |
| 2012/0050441 | A1* | 3/2012 | Mikami | B82Y 40/00 347/110 |
| 2012/0131056 | A1* | 5/2012 | Matsuoka | G06F 16/21 707/776 |

(Continued)

FOREIGN PATENT DOCUMENTS

| JP | 2004177943 A | 6/2004 |
| JP | 2005532576 A | 10/2005 |
| JP | 2010123757 A | 6/2010 |

(Continued)

*Primary Examiner* — Jerzi H Moreno Hernandez
(74) *Attorney, Agent, or Firm* — Rossi, Kimms & McDowell LLP

(57) ABSTRACT

A forming apparatus configured to, in a state in which a composition on a substrate and a mold have been brought into contact, cure the composition to thereby mold the composition, is provided. The forming apparatus includes a supplier configured to discretely supply droplets of the composition onto the substrate, a controller configured to control the supplier in accordance with a supply pattern that indicates a drop amount and a drop position of each droplet. The shot region has a rectangular outer shape. The controller determines the supply pattern such that a minimum distance between adjacent droplets supplied onto the shot region by the supplier gradually decreases from a center of each side of the rectangular outer shape of the shot region toward both corners of the each side of the rectangular outer shape of the shot region.

10 Claims, 11 Drawing Sheets

(56) References Cited

U.S. PATENT DOCUMENTS

2015/0048050 A1* 2/2015 Sreenivasan .......... G03F 7/0002
216/37
2016/0291486 A1* 10/2016 Funayoshi ............ G03F 7/0002

FOREIGN PATENT DOCUMENTS

| JP | 2014120697 A | | 6/2014 |
|---|---|---|---|
| JP | 2016082100 A | * | 5/2016 |
| JP | 2016082100 A | | 5/2016 |
| JP | 2018098507 A | | 6/2018 |
| JP | 2018180169 A | | 11/2018 |

* cited by examiner

SHOT REGION

FORMING APPARATUS, DETERMINATION METHOD, AND ARTICLE MANUFACTURING METHOD

BACKGROUND OF THE INVENTION

Field of the Invention

The present invention relates to a forming apparatus, a determination method, and a method of manufacturing an article.

Description of the Related Art

There are forming apparatuses for forming by a forming process a curable composition arranged on a substrate. The forming process may include a contact step of bringing the composition on the substrate and the mold into contact, a curing step of curing the composition in a state in which the composition and the mold are in contact, and a separating step of separating the composition from the mold after the curing.

As a typical example of a forming apparatus, an imprint apparatus for manufacturing an article such as a semiconductor device has been attracting attention. For example, in an imprint apparatus employing a photocuring method, first, an imprint material which is a photocurable composition is supplied to a shot region which is an imprint region on a substrate. Next, while aligning the pattern portion of the mold and the shot region, the mold and the imprint material supplied to the substrate are brought into contact with each other, and the mold is filled with the imprint material. Then, the imprint material is cured by irradiation of light, and after that the mold and the imprint material are pulled apart (separated). In this way, a pattern of the imprint material is formed on the shot region of the substrate.

Since the imprint apparatus, when the imprint material supplied to the shot region and the mold are brought into contact with each other, applies pressure to the imprint material and the mold, the imprint material may move to spread, and the imprint material may be extruded to the outside of the shot region and the substrate. Japanese Patent Laid-Open No. 2018-98507 discloses an arrangement of an imprint material on the outer periphery of a shot region. This document discloses a technique in which, in an imprint apparatus for supplying an imprint material by a dispense method, an arrangement interval of droplets of an imprint material is controlled by changing a movement speed of a substrate stage at a time of supplying the imprint material. By controlling the arrangement interval of the droplets of the imprint material, the amount of the imprint material that is extruded to the outside the shot region can be controlled.

In the imprint apparatus, when the mold and the imprint material on the substrate are brought into contact with each other, the contact is started in a state in which the mold is deformed into a shape that is convex toward the substrate. As a result, in the mold, the contact with the imprint material is started from the center of the shot region, and the contact between the pattern portion and the imprint material proceeds (the contact region expands) toward the outer periphery of the shot region, and thereby it is possible to reduce air being trapped. While the shape of the contact surface between the mold and the imprint material on the substrate is circular, the shape of the shot region is generally rectangular, and therefore the time for the imprint material to arrive at an edge of each shot region (a respective side of the rectangular pattern portion) is different. In particular, the imprint material arrives at the four corners of the shot region (the mold and the imprint material contact each other) last. At the point where the imprint material first arrives at the edge of the shot region, the imprint material is easily extruded to the outside of the shot region. Meanwhile, there are cases in which the imprint material does not fully arrive at a location where the imprint material is to lastly arrive at an edge of the shot region, and the mold ends up not being filled.

SUMMARY OF THE INVENTION

The present invention provides, for example, a forming apparatus which is advantageous at achieving both suppression of extrusion of the composition and improvement of the filling property of the composition.

The present invention in its one aspect provides a forming apparatus operable to, in a state in which a composition on a substrate and a mold have been brought into contact, cure the composition to thereby mold the composition. The forming apparatus comprises a supplier configured to discretely supply droplets of the composition onto the substrate, a controller configured to control the supplier in accordance with a supply pattern that indicates a drop amount and a drop position of each droplet, wherein the controller determines the supply pattern such that a minimum distance between adjacent droplets supplied onto the substrate by the supplier is smaller at a corner than at a center of an outermost side of a region to which the composition is supplied.

Further features of the present invention will become apparent from the following description of exemplary embodiments (with reference to the attached drawings).

DESCRIPTION OF THE EMBODIMENTS

Figure 1:
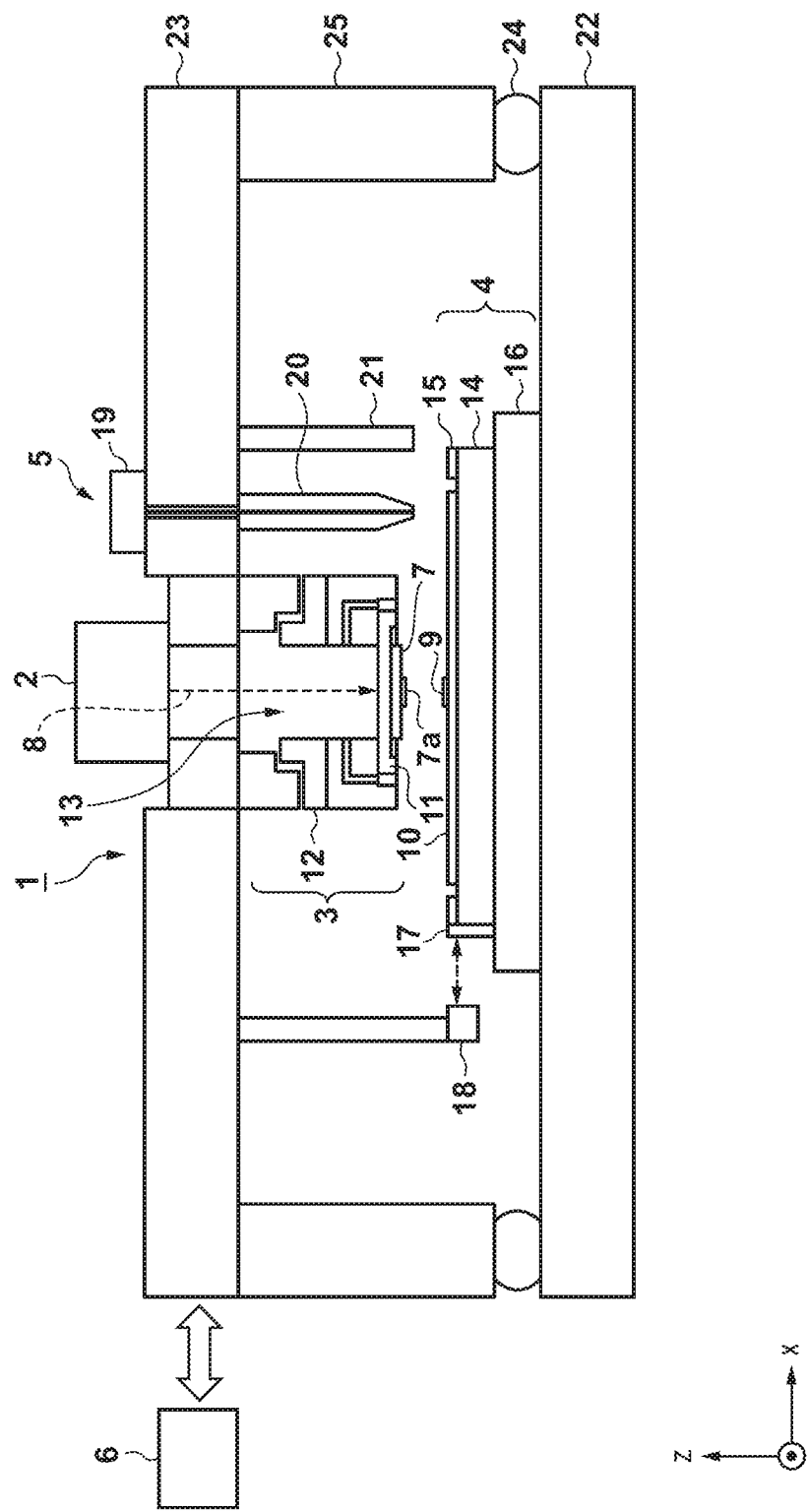
FIG. 1 is a diagram illustrating a configuration of an imprint apparatus in an embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

First Embodiment

The present invention relates to a forming apparatus for performing forming processing for forming a curable composition (hereinafter referred to simply as a "composition") on a substrate. The forming process may include a supply step of discretely supplying droplets of a composition onto the substrate and bringing the composition supplied on the substrate and a mold (an original plate, a template) as a component into contact. The forming process may further include curing the composition in a state in which the composition and the mold are in contact, and a separating step of separating the composition from the mold after the curing.

In the present embodiment, an imprint apparatus, which is a specific example of a forming apparatus, will be described. FIG. 1 is a diagram illustrating a configuration of an imprint apparatus 1 in an embodiment. Note that in the present specification and the accompanying drawings, directions are given in an XYZ coordinate system in which directions parallel to the surface of the substrate 10 form the XY plane. In the XYZ coordinate system, directions parallel to the X-axis, Y-axis, and Z-axis are respectively defined as an X direction, a Y direction, and a Z direction, and rotation about the X-axis, rotation about the Y-axis, and rotation about the Z-axis is respectively given as θX, θY, and θZ.

First, an outline of an imprint apparatus according to embodiments will be described. In the imprint apparatus 1, an imprint material 9, which is a curable composition supplied onto a substrate 10, and a mold 7 are brought into contact with each other, and energy for curing is applied to the imprint material 9, thereby forming a cured product in which a concavo-convex pattern of the mold 7 is transferred onto the substrate.

As the imprint material, a curable composition (sometimes referred to as a resin in an uncured state) which is cured by application of energy for curing is used. As the energy for curing, electromagnetic waves, heat, or the like can be used. The electromagnetic waves can be, for example, light whose wavelength is selected from a range of 10 nm or more to 1 mm or less, for example, infrared rays, visible rays, ultraviolet rays, or the like. The curable composition may be a composition that is cured by irradiation with light or by heating. Among these, a photo-curable composition which is cured by irradiation with light contains at least a polymerizable compound and a photopolymerization initiator, and may further contain a non-polymerizable compound or a solvent as necessary. The non-polymerizable compound is of at least one type selected from the group consisting of a sensitizer, a hydrogen donor, an internal mold release agent, a surfactant, an antioxidant, a polymer component, and the like. The imprint material may be arranged on the substrate in the form of droplets or in the form of an island or a film formed by connecting a plurality of droplets by a liquid injection head. The viscosity of the imprint material (the viscosity at 25° C.) may be, for example, 1 mPa/s or more and 100 mPa/s or less.

As the material of the substrate 10, for example, glass, ceramic, metal, semiconductor, resin, or the like can be used. If necessary, a member made of a material different from that of the substrate may be provided on the surface of the substrate. The substrate is, for example, a silicon wafer, a compound semiconductor wafer, or quartz glass. The substrate may be a glass substrate for manufacturing a replica mask from a master mask by an imprint process.

The imprint apparatus 1 of FIG. 1 employs a photocuring method in which an imprint material is cured by irradiation with light. The mold holding unit 3 includes a mold chuck 11 that attracts and holds the mold 7 by a vacuum absorption force or an electrostatic force, and a mold moving mechanism 12 that moves the mold chuck 11 (in other words, the mold 7). The mold chuck 11 and the mold moving mechanism 12 have an opening at the center (inside) so that the imprint material 9 on the substrate 10 is irradiated with the light from the irradiation unit 2. The mold moving mechanism 12 moves the mold 7 in the Z direction so as to selectively bring the imprint material of the substrate 10 and the mold 7 into contact (imprint) and separate (release) the imprint material 9 on the substrate 10 from the mold 7. Actuators applicable to the mold moving mechanism 12 include, for example, a linear motor and an air cylinder. The mold moving mechanism 12 may be composed of a plurality of drive systems such as a coarse driving system and a fine driving system in order to position the mold 7 with high accuracy. The mold moving mechanism 12 may be configured to be able to move the mold 7 not only in the Z direction but also in the X direction and the Y direction. Further, the mold moving mechanism 12 may have a tilt mechanism for adjusting the position of the mold 7 in the Z direction and the inclination of the mold 7 with respect to the XY plane.

The mold 7 has a rectangular outer peripheral shape, and has a pattern portion 7a including a pattern (concavo-convex pattern to be transferred to the substrate 10 such as a circuit pattern) formed three-dimensionally on a surface (pattern surface) facing the substrate. The mold 7 is made of a material through which light can pass, for example, quartz. In addition, the mold 7 may have a cavity having a circular planar shape and a certain depth on the surface irradiated with light 8.

An irradiation unit 2 functions as a curing unit for irradiating light as energy for curing the imprint material. In the imprint processing (forming processing), the irradiation unit 2 irradiates light 8 (for example, ultraviolet rays) onto the imprint material on the substrate 10 via the mold 7. The irradiation unit 2 includes a light source and an optical element (a lens, a mirror, a light shielding plate, or the like) for adjusting the light from the light source to a state (an intensity distribution of light, the illuminated region or the like) of the light 8 suitable for the imprint process. Since the photocuring method is employed in the present embodiment, the imprint apparatus 1 includes the irradiation unit 2 as a curing unit. However, when a heat-curing method is employed, the imprint apparatus 1 has a heat source for curing the imprint material (thermosetting composition) instead of the irradiation unit 2.

A substrate chuck 14 attracts and holds the substrate 10 by a vacuum absorption force or an electrostatic force. An auxiliary member 15 is arranged around the substrate chuck 14 so as to surround the substrate 10 held by the substrate chuck 14. In addition, the auxiliary member 15 is arranged so that its upper surface and the upper surface of the substrate 10 held by the substrate chuck 14 have substantially the same height. The substrate chuck 14 is mounted on a stage driving mechanism 16. Here, the substrate chuck 14 and the stage driving mechanism 16 are collectively referred to as a substrate stage 4 (moving unit). The substrate stage 4 is movable in the XY plane. When bringing a pattern portion 7a of the mold 7 and the imprint material on the substrate 10 into contact, the position of the substrate stage 4 is adjusted, and thereby the position of the mold 7 and the position of the substrate 10 are aligned with each other. Actuators applicable to the substrate stage 4 include, for example, a linear motor and an air cylinder. The substrate stage 4 may be configured to be able to move the substrate 10 not only in the X direction or the Y direction but also in the Z direction. The imprinting and releasing are realized by moving the mold 7 in the Z direction. However, imprinting and releasing may be realized by moving the substrate 10 in the Z direction. Alternatively, imprinting and releasing may be realized by moving both the mold 7 and the substrate 10 relatively in the Z direction. Also, the substrate stage 4 may have a tilt mechanism for adjusting the position of the substrate 10 in the θZ direction and the inclination of the substrate 10 with respect to the XY plane.

In addition, the substrate stage 4 includes a plurality of reference mirrors 17 corresponding to each direction of X, Y, Z, θx, θy, and θz on the side surface thereof. On the other hand, the imprint apparatus 1 includes a plurality of laser interferometers 18 for measuring the position of the substrate stage 4 by irradiating the reference mirrors 17 with beams of helium neon or the like. Note that FIG. 1 illustrates only one set of the reference mirror 17 and the laser interferometer 18 for clarity of the drawing. The laser interferometer 18 measures the position of the substrate stage 4 in real time, and a controller 6, which will be described later, executes control for positioning the substrate 10 (the substrate stage 4) based on a measurement value at that time. An encoder may be used to measure the position of the substrate stage 4.

The auxiliary member 15 has a function of preventing a gas having at least one of properties of high solubility and high diffusivity, which will be described later, from entering the optical path between the reference mirror 17 and the laser interferometer 18. In addition, the presence of the auxiliary member 15 has the effect that the concentration of a gas described later can be kept high, particularly when imprinting a shot region in the vicinity of the outer periphery of the substrate 10. Here, there may be a difference between the height of the upper surface of the auxiliary member 15 and the height of the upper surface of the substrate 10 held by the substrate chuck 14, as long as a difference of 1% or more in the concentration of the gas does not occur between the space above the auxiliary member 15 and the space above the substrate 10. For example, the difference in height between the upper surface of the auxiliary member 15 and the upper surface of the substrate 10 held by the substrate chuck 14 may be 1 mm or less. More preferably, the difference in height between the upper surface of the auxiliary member 15 and the upper surface of the substrate 10 held by the substrate chuck 14 may be 0.1 mm or less.

A supplier 5 is disposed in the vicinity of the mold holding unit 3, and supplies the imprint material 9 to at least one shot region (mold region) on the substrate 10. The supplier 5 employs an inkjet method, and supplies droplets of an imprint material discretely onto a substrate. The supplier 5 includes a container 19 for accommodating the imprint material 9 in an uncured state, and an ejection unit 20 (dispenser). It is desirable that the container 19 be capable of managing the imprint material 9 while maintaining an atmosphere containing, for example, some oxygen so as not to cause a curing reaction of the imprint material 9 inside the container 19. Further, it is desirable that the material of the container 19 be such that particles and chemical impurities are not mixed into the imprint material 9. The ejection unit 20 has, for example, a piezo-type discharge mechanism (ink jet head) including a plurality of ejection ports. The drop amount (discharge amount) of the droplets of the imprint material 9 can be adjusted in the range of 0.1 to 10 pL/droplet, and is usually used at about 1 pL/droplet in many cases. The supply amount of the imprint material 9 is determined based on the density of the pattern portion 7a and the desired residual layer thickness. The supplier 5 disperses the imprint material 9 as droplets to thereby arrange it on the shot region in accordance with a supply pattern indicating the drop amount and the drop position of each droplet based on an operation instruction from the controller 6, which will be described later.

An alignment measurement unit 21 measures an alignment mark formed on the substrate 10. The imprint apparatus 1 further includes a platen 22 on which the substrate stage 4 is placed and that forms a reference plane, a bridge platen 23 for fixing the mold holding unit 3, and a support 25 extending from the platen 22 and supporting the bridge platen 23 via a vibration isolator 24 for removing vibration from the floor surface. Further, the imprint apparatus 1 may include, although not illustrated in the drawings, a mold conveyance unit for loading and unloading the mold 7 between the outside of the apparatus and the mold holding unit 3, and a substrate conveyance unit for loading and unloading the substrate 10 between the outside of the apparatus and the substrate stage 4, and the like.

The controller 6 is constituted by at least one computer including a CPU, a memory, and the like. The controller 6 is connected to each component of the imprint apparatus 1 via a line, and controls operation, adjustment, and the like of each component of the imprint apparatus 1 in accordance with a program stored in a memory. The memory of the controller 6 stores data of the above described supply pattern, and the controller 6 controls the supplier 5 in accordance with the supply pattern. Note that the controller 6 may be configured integrally with other parts of the imprint apparatus 1 (in a common housing), or may be configured separately from other parts of the imprint apparatus 1 (in a separate housing).

Next, an imprint method (imprint processing) by the imprint apparatus 1 will be described. First, the controller 6 places and fixes the substrate 10 on the substrate stage 4 by the substrate conveyance unit. Next, the controller 6 causes an alignment measurement unit 21 to sequentially measure the alignment marks on the substrate 10 while appropriately changing the position of the substrate 10 by driving the stage driving mechanism 16, and detects the position of the substrate 10 with high accuracy. Then, the controller 6 calculates each transfer coordinate from the detection result, and sequentially shapes a pattern for each predetermined shot region based on the calculation result (step and repeat). As a flow of pattern forming for one shot region, first, the controller 6 causes the stage driving mechanism 16 to position the imprint material supply position on the substrate 10 (a specific position on the shot region) under the ejection port of the ejection unit 20. Thereafter, the supplier 5 supplies the imprint material 9 to the shot region on the substrate 10 (supply step). For example, the ejection unit 20 has a plurality of ejection ports arranged at regular intervals in the sub-scanning direction (for example, the Y direction), and supplies droplets of the imprint material discretely onto the shot region in a linear manner. The imprint apparatus 1 can supply the imprint material to a region of an arbitrary shape such as a rectangular shape on the shot region by moving the substrate stage 4 (in other words, the substrate 10) in the scanning direction (for example, the X direction) while supplying the imprint material.

Next, the controller 6 causes the stage driving mechanism 16 to move and position the substrate 10 so that the shot region is positioned at the imprint position immediately below the pattern portion 7a. Next, the controller 6 performs alignment between the pattern portion 7a and the substrate-side pattern on the shot region, magnification correction of the pattern portion 7a by a magnification correction mechanism, and the like. Thereafter, the mold moving mechanism 12 is driven to bring the imprint material 9 on the shot region and the pattern portion 7a into contact (contact step). After the pattern portion 7a is deformed into a convex shape toward the substrate 10, the contact between the imprint material 9 and the pattern portion 7a is started. By this contact step, the imprint material 9 is filled in the concavo-convex pattern on the pattern portion 7a. Note that the controller 6 determines the completion of the contact (imprint) by a load sensor (not illustrated) installed inside the mold holding unit 3. In this state, the irradiation unit 2 irradiates the light 8 from the back surface (upper surface) of the mold 7 for a predetermined time, and cures the imprint material 9 by the light 8 transmitted through the mold 7 (curing step). After the imprint material 9 is cured, the controller 6 re-drives the mold moving mechanism 12 to separate the pattern portion 7a and the imprint material 9 (separation step). Thereby, a three-dimensionally shaped imprint material pattern (layer) is formed on the surface of the shot region on the substrate 10, and follows the concavo-convex pattern of the pattern portion 7a. By performing such a series of imprint operations a plurality of times while changing the shot region by driving the substrate stage 4, the imprint apparatus 1 can form a pattern of an imprint material in each of a plurality of the shot regions on one substrate 10.

When the imprint material 9 is filled into the pattern portion 7a in the contact step, a defect may occur in the formed pattern if air present between the mold 7 and the substrate 10 enters the pattern portion 7a. Therefore, a gas having as a property at least one of high solubility and high diffusivity with respect to the imprint material 9 may be supplied to the space between the mold 7 and the substrate 10.

Figure 2:
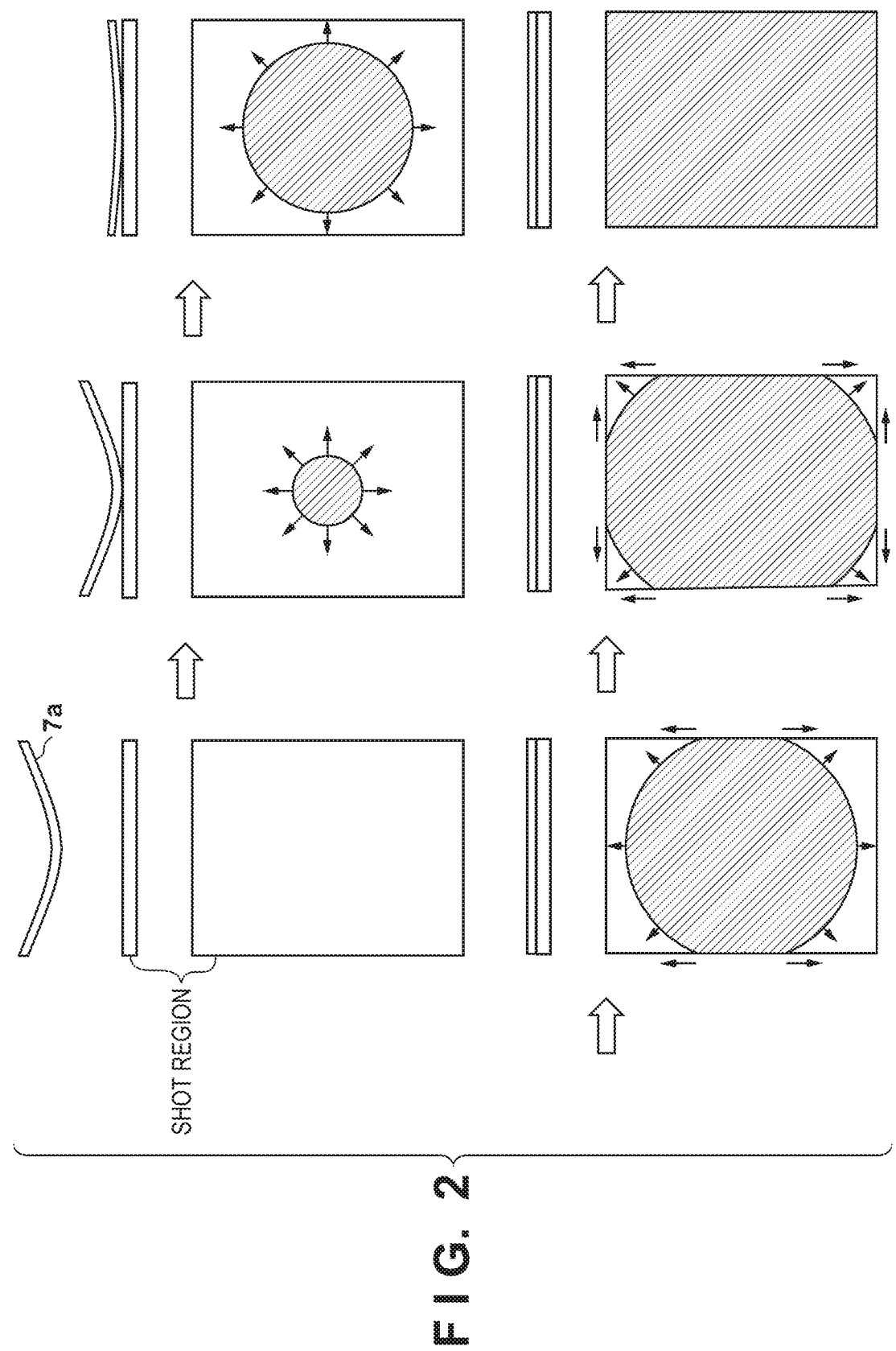
FIG. 2 is a view illustrating progress of contact between a pattern portion of a mold and an imprint material on a substrate.

The supply step and the contact step in the embodiment will be described in more detail. FIG. 2 is a diagram illustrating the progress of contact between the pattern portion 7a and the imprint material 9 in the contact step. In the contact step, the pattern portion 7a starts to contact the imprint material 9 while the pattern portion 7a is deformed into a convex shape toward the substrate 10. As illustrated in FIG. 2, the initial shape of the contact surface (contact region) is a circular shape, and the contact region expands outward as the contact step proceeds. Since the shape of the shot region is generally rectangular, the pattern portion 7a and the times until arrival at the respective edges (sides) of the shot region differ. In FIG. 2, the left and right edges of the shot region contact the pattern portion 7a earlier than the upper and lower edges of the shot region. Also, on one side of the shot region, contact is made first from the center of the side, and contact is made later the more toward the corner you go (regions corresponding to the four corners of the rectangular region). Therefore, the four corners of the shot region contact last.

Figure 3:
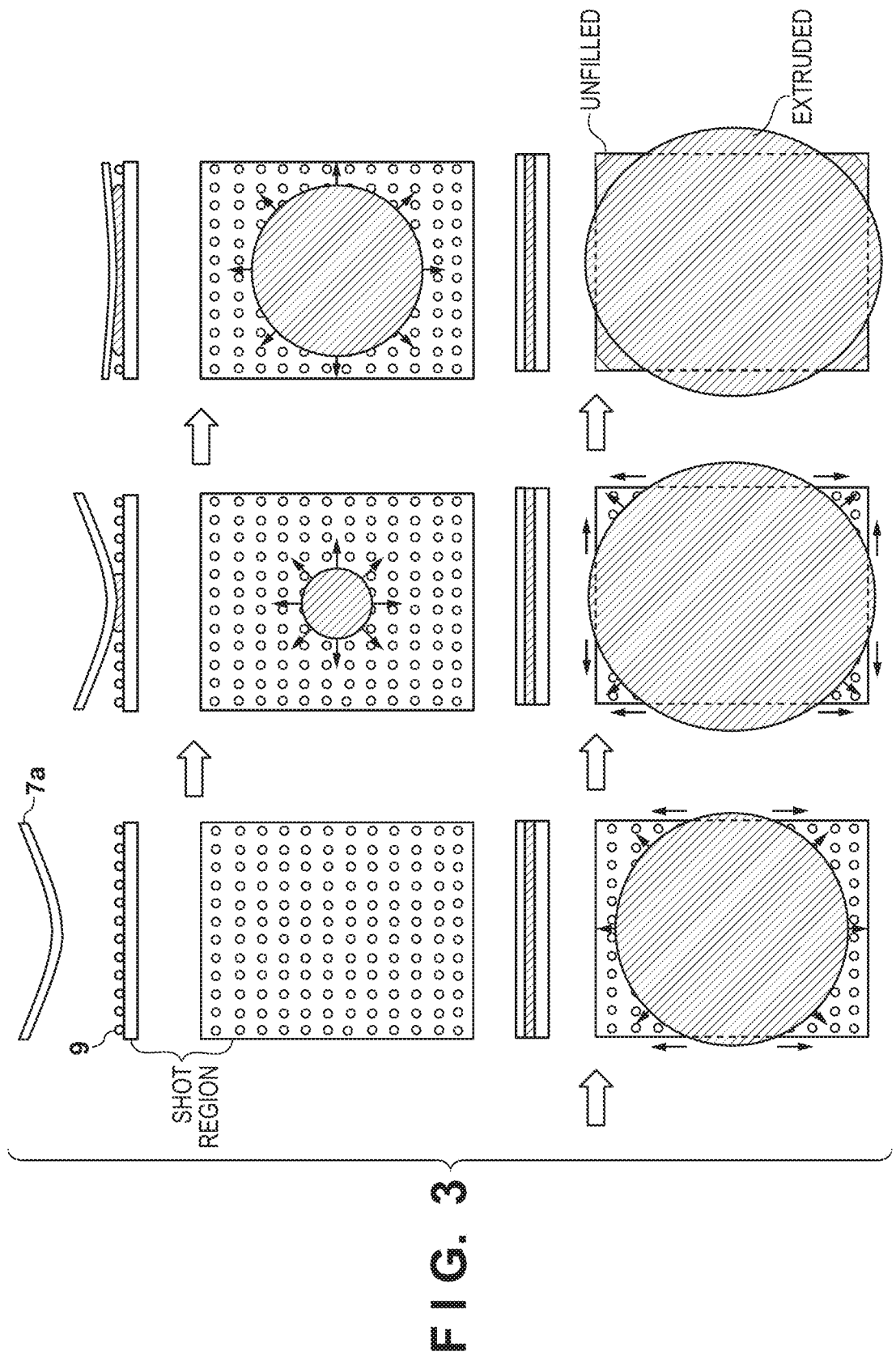
FIG. 3 is a view illustrating the occurrence where the imprint material is extruded and unfilled in the prior art.

FIG. 3 is a view illustrating the progress of the contact between the pattern portion 7a and the imprint material 9 in the contact step similarly to FIG. 2, but illustrates a case where the droplets of the imprint material 9 are all arranged at the same volume and at regular intervals in the shot region. Due to the difference in the time of arrival of the imprint material 9 at each edge, the imprint material 9 is easily extruded to the exterior of the shot region at the first arrival points, and the imprint material 9 can easily fail to arrive at the last arrival points (the corners) and the mold unfilled by the imprint material 9 thereat.

Figure 4:
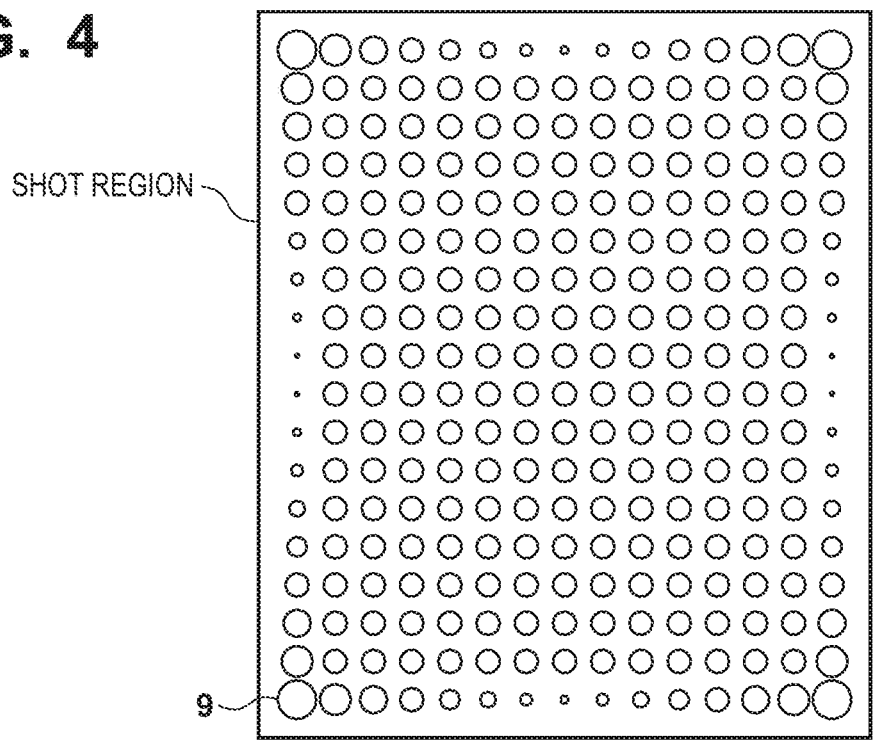
FIG. 4 is a view illustrating an example of a supply pattern of an imprint material in the embodiment.

Therefore, the controller 6 determines the supply pattern so that the minimum distance between adjacent droplets supplied onto the shot region of the substrate 10 by the supplier 5 is smaller at the corners than at the center of the outermost sides of the region to which the imprint material is supplied. FIG. 4 illustrates an example of a supply pattern (arrangement layout) of an imprint material in the embodiment. The supply pattern indicates the drop amount and the drop position of each droplet, and in FIG. 4, the size of the droplet represents the drop amount (discharge amount) of the droplet. By increasing the drop amount per droplet, the minimum distance between adjacent droplets can be reduced. As illustrated in FIG. 4, since the center of the outermost side of the region to which the imprint material is supplied is a portion where the imprint material first comes into contact with the edge of the shot region, the drop amount per droplet is reduced thereat. On the other hand, the drop amount per droplet increases toward the corner of the outermost side of the region to which the imprint material is supplied. Since the imprint material 9 has sufficient time to spread at the first contact point, the drop amount may be reduced. In order to prevent the mold from being unfilled, due to the time over which the imprint material 9 expands being short, the drop amount is increased at the corner locations that are the last to be contacted.

Hereinafter, a determination method for determining the supply pattern will be described. In an embodiment, the initial supply pattern is adjusted based on the time from the start of contact between the composition supplied to the shot region and the mold according to the initial supply pattern until the composition is spread to arrive at the edge of the shot region. The supply pattern is determined thereby.

Figure 5:
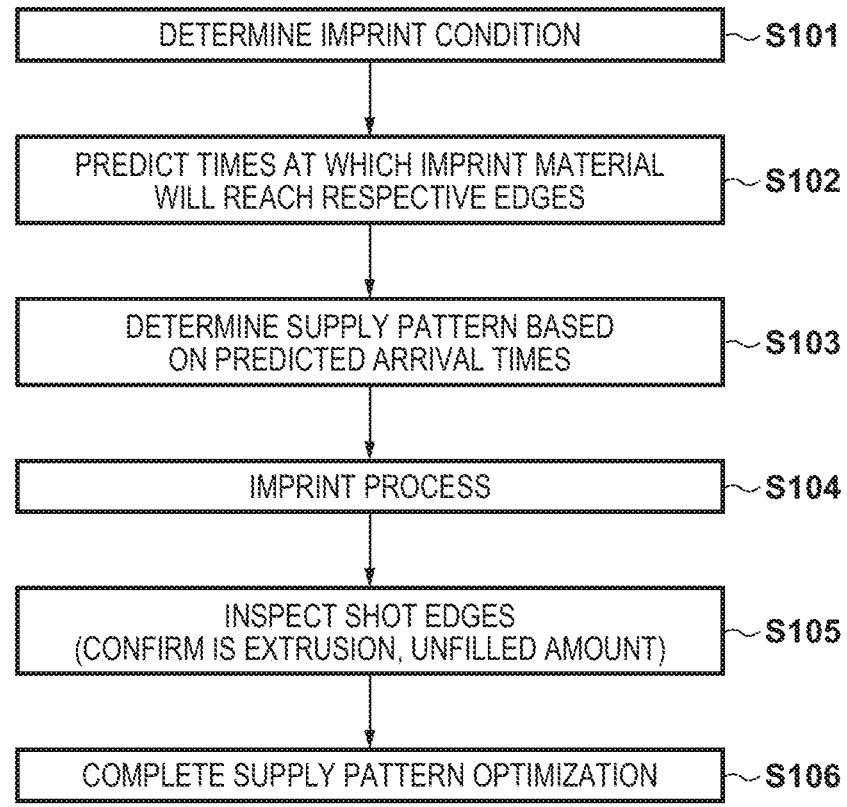
FIG. 5 is a flowchart illustrating a method for determining a supply pattern in an embodiment.

FIG. 5 illustrates a flowchart of a determination method for determining a supply pattern. The controller 6 determines an imprint condition to be used for imprinting (step S101). The imprint condition may include the velocity and force of the movement of the mold 7 by the mold moving mechanism 12 when the mold 9 and the imprint material 9 are brought into contact, the deformation amount for deforming the pattern portion 7a into a convex shape, and the like. When the contact step is executed after the supply step is executed on the shot region in accordance with the initial supply pattern, the controller 6 calculates (predicts) the times at which the respective edges of the shot region of the imprint material 9 will be arrived at based on the above described determined imprint condition (step S102). Here, the initial supply pattern may be, for example, a pattern in which droplets of the same size are uniformly distributed as illustrated in FIG. 3. Based on the predicted arrival times, the controller 6 determines the supply pattern by adjusting the initial supply pattern so that the difference between the first arrival times and the last arrival times of the imprint material at the edges of the shot region in the contact step is small (step S103).

The controller 6 performs an imprint process on the shot region using the determined supply pattern (step S104). After completion of the imprint process, the edges of the shot region can be inspected to confirm extrusion of imprint material and whether the mold is unfilled (step S105). This inspection may be performed using the alignment measurement unit 21 mounted on the imprint apparatus 1, or may be performed using another measuring instrument exclusively provided inside or outside the imprint apparatus 1. If, for the respective edges of the shot region, there is neither extrusion of the imprint material nor is the mold unfilled, then the optimization of the supply pattern is complete (step S106). If the imprint material is extruded or the mold unfilled, the process returns to step S103 and the supply patterns can be readjusted.

In this manner, by changing the drop amount of one drop of the imprint material 9 in accordance with the arrival time of the imprint material 9 to each edge of the shot region, it is possible to reduce the extrusion of the imprint material from the edge of the shot region and the mold being unfilled by the imprint material.

Second Embodiment

In the first embodiment described above, the minimum distance between adjacent droplets is reduced by increasing the drop amount per droplet (FIG. 4). In contrast, in the second embodiment described below, the minimum distance between adjacent droplets is reduced by reducing the center-to-center distance (pitch), which is the distance from the center of the droplet to the center of the adjacent droplet. Reducing the center-to-center distance increases the droplet arrangement density, and increasing the center-to-center distance decreases the droplet arrangement density.

Figure 6:
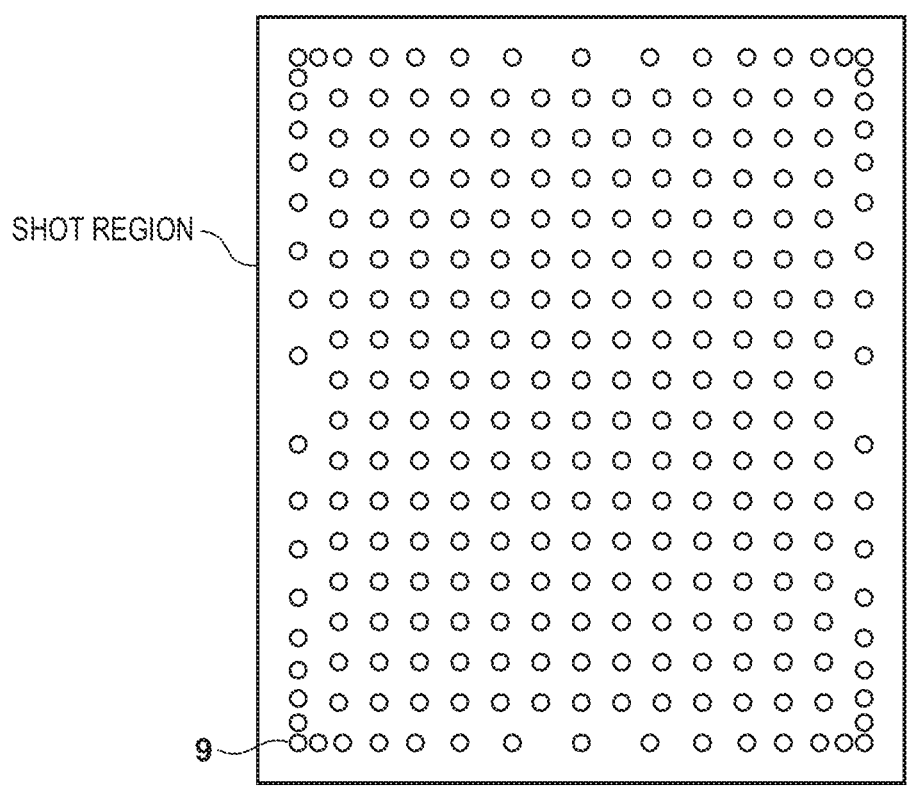
FIG. 6 is a view illustrating an example of a supply pattern for an imprint material in an embodiment.

FIG. 6 illustrates an example of a supply pattern (arrangement layout) of an imprint material in the second embodiment. As illustrated in FIG. 6, since the center of the outermost side of the region to which the imprint material is supplied is a portion where the imprint material first comes into contact with the edge of the shot region, the center-to-center distance between adjacent droplets is increased thereat. On the other hand, as you go toward the corner of the outermost side of the region to which the imprint material is supplied, the center-to-center distance of adjacent droplets is made smaller. Since the imprint material 9 has sufficient time to spread for the locations that are contacted first, the arrangement density of the droplets may be low thereat, that is, the center-to-center distance may be increased. In order to prevent the mold from being unfilled since the time over which the imprint material 9 expands is short, at the corner locations that are the last to be contacted, the droplet arrangement density is increased, that is the center-to-center distance is decreased.

Figure 7:
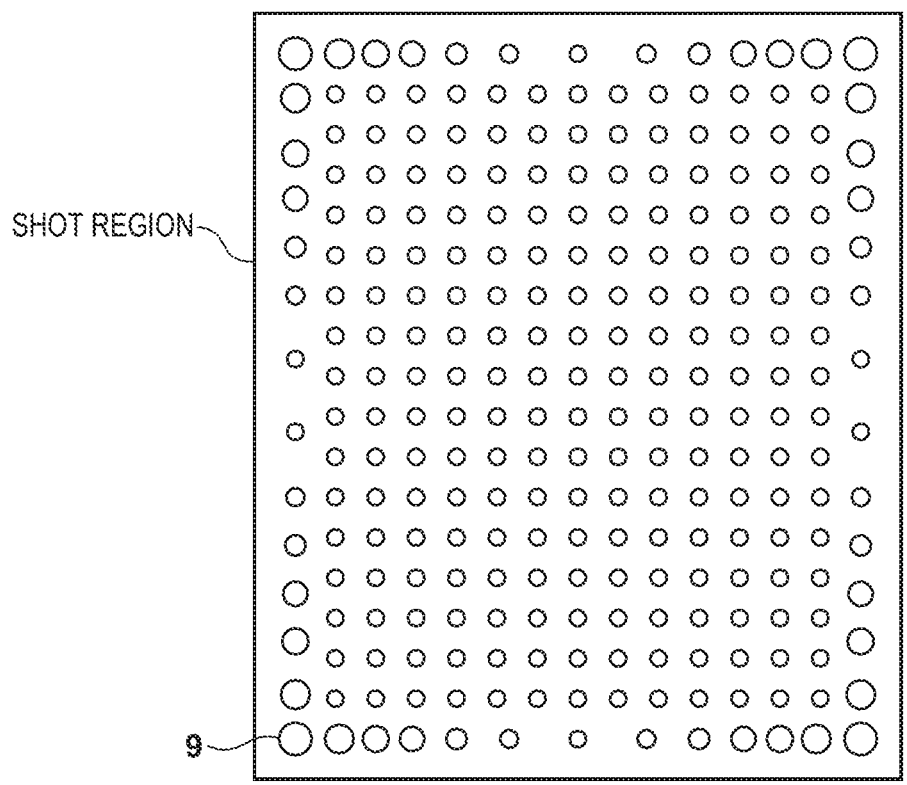
FIG. 7 is a view illustrating an example of a supply pattern for an imprint material in an embodiment.

As a variation, the minimum distance between adjacent droplets may be adjusted by changing both the drop amount per droplet and the center-to-center distance of adjacent droplets. FIG. 7 illustrates an example of a supply pattern (arrangement layout) of an imprint material in the variation. As illustrated in FIG. 7, since the center of the outermost side of the region to which the imprint material is supplied is the location at which the imprint material first contacts the edge of the shot region, the center-to-center distance of adjacent droplets increases as the drop amount per droplet decreases. On the other hand, as you go toward the corner of the outermost side of the region to which the imprint material is supplied, the drop amount per droplet are made to become larger and the center-to-center distance of adjacent droplets are made to become smaller.

In the case where the shortening of the center-to-center distance is restricted due to the range in which the drop amount changes or intervals between a plurality ejection ports, or the like, it is effective to change both the drop amount and the center-to-center distance of the imprint material 9.

Third Embodiment

Figure 8:
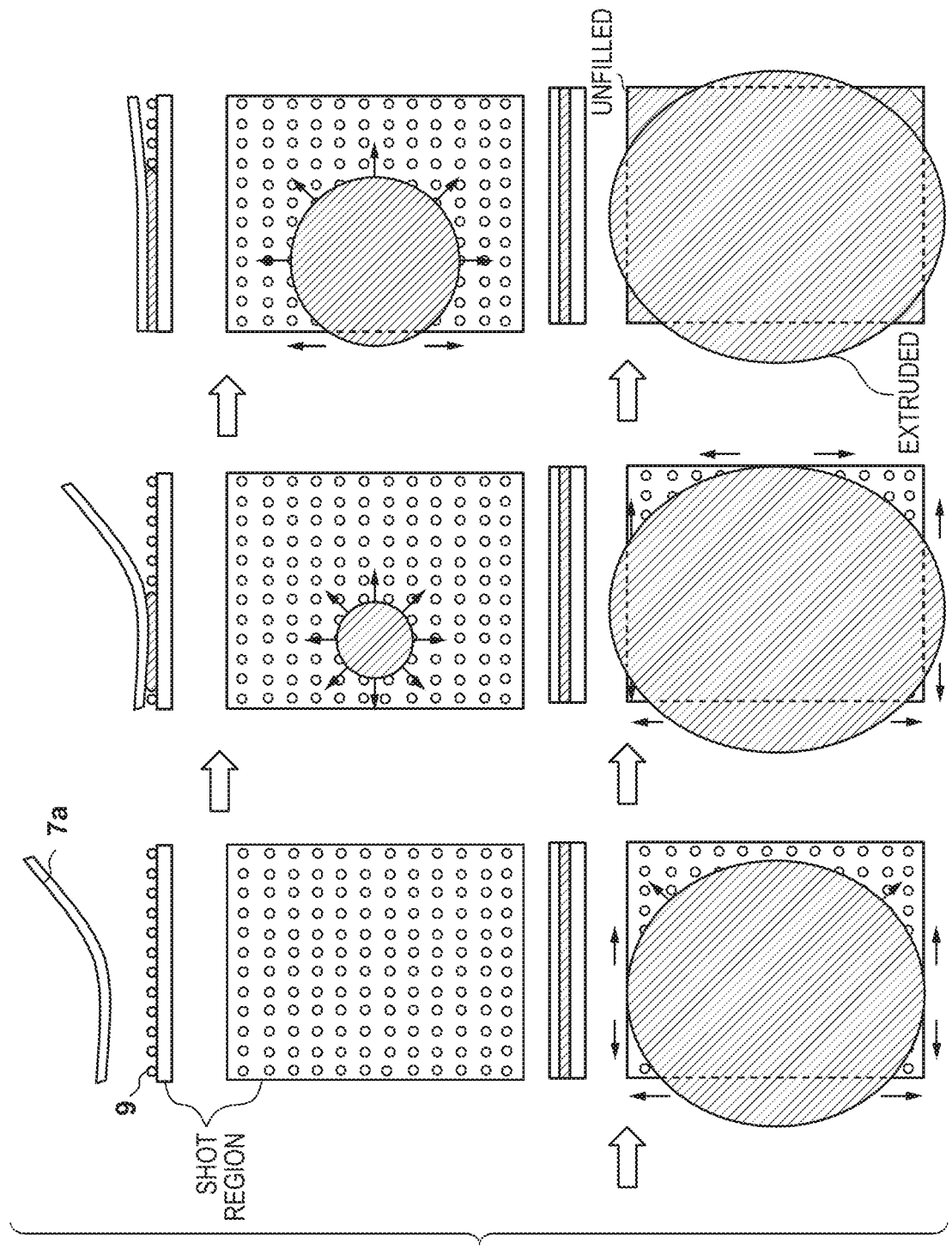
FIG. 8 is a view illustrating progress in the prior art of contact between a pattern portion of a mold and an imprint material on a substrate in a case where the mold is inclined.
Figure 9:
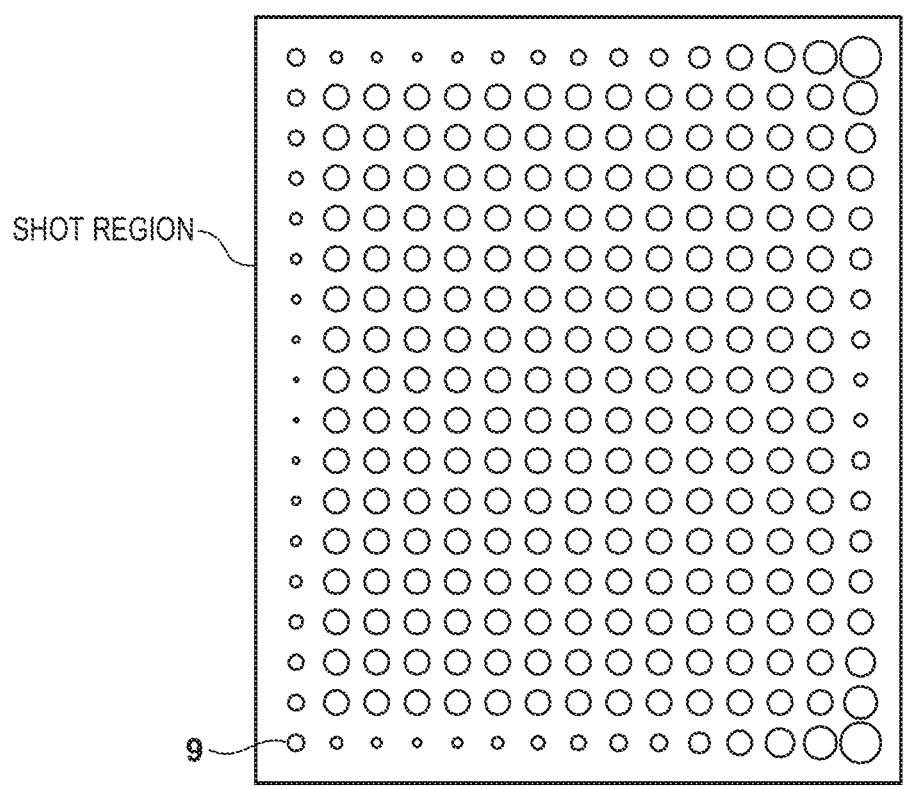
FIG. 9 is a view illustrating an example of a supply pattern of an imprint material in the embodiment.

In the first and second embodiments described above, it is assumed that the imprint material simultaneously arrive at the left edge and the right edge of the shot region, and the imprint material simultaneously arrives at the top edge and the bottom edge of the shot region. However, in order to improve alignment performance and the like, as illustrated in FIG. 8, there are cases in which the mold 7 is actively inclined when performing the imprint processing. In such cases, since the time at which the imprint material 9 arrives at the edge of the shot region is different for each of the top, bottom, left, and right edges, the amount of extrusion of the imprint material and of the degree to which the mold is unfilled by the imprint material at each edge is different. Therefore, as illustrated in FIG. 9, the drop amount per droplet is optimized on each of the outermost sides of the region to which the imprint material is supplied. In the example of FIG. 9, the change of the drop amount per droplet is the same on the upper side and the lower side, and the change of the drop amount per droplet is different on the left side and the right side. As in the second embodiment, the center-to-center distance of adjacent droplets may be changed, or both the drop amount per droplet and the center-to-center distance of adjacent droplets may be changed. As the method of determining the supply pattern, the method described in the first embodiment can be used.

Figure 10:
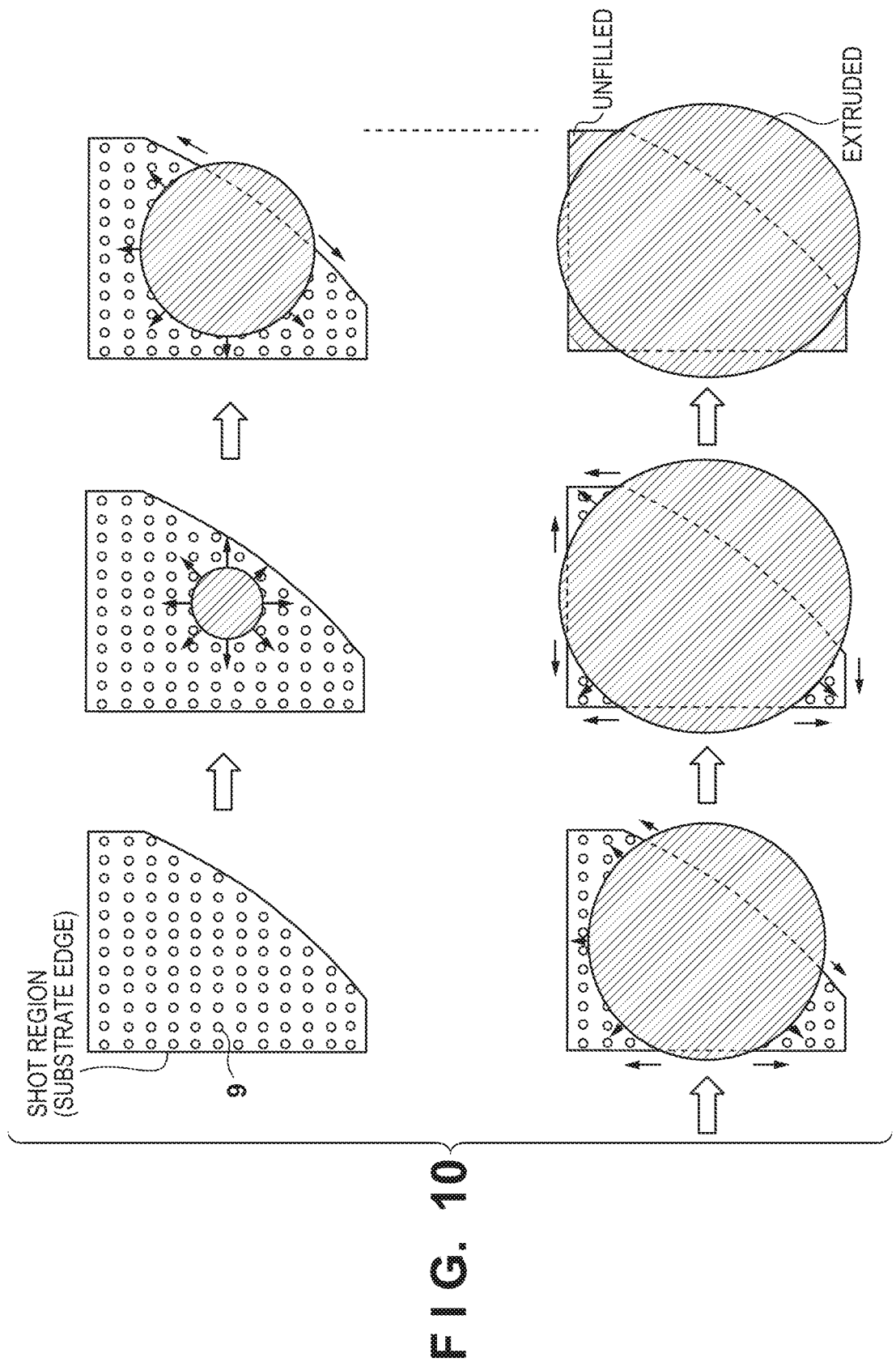
FIG. 10 is a view illustrating progress in the prior art of contact between a pattern portion of a mold and an imprint material in a peripheral shot region on a substrate.
Figure 11:
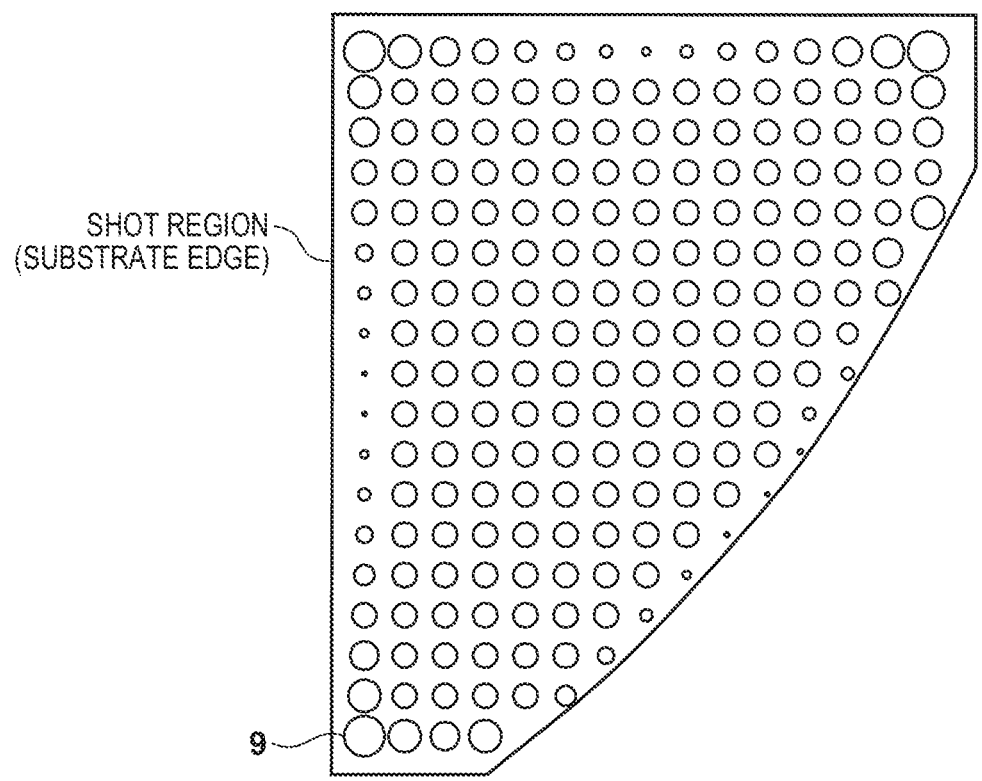
FIG. 11 is a view illustrating an example of a supply pattern for an imprint material corresponding to a peripheral shot region in an embodiment.

As another modification, a case where imprint processing is executed on a peripheral shot region of the substrate 10 will be considered. "Peripheral shot region" refers to a shot region in which a part is extruded to the outer periphery of the substrate and only a part of a pattern portion of a mold in the outer periphery of the substrate is transferred, and "peripheral shot region" may also be referred to as a "deficient shot region". In the case of a peripheral shot region, as illustrated in FIG. 10, one side (left side in FIG. 10) is an edge of the shot region, but the other side is a substrate edge. When the imprint material is extruded from the substrate 10, there is a possibility that a peripheral member or the like will be contaminated, and therefore, it is necessary to reduce the extrusion of the imprint material from the edge of the substrate. Since the outer shape of the substrate 10 is circular, the arrival time to each edge of the peripheral shot region of the imprint material 9 and the substrate edge differs depending on the shape (curve) of the substrate edge. Therefore, it is necessary to determine the coating amount for the imprint material 9 in accordance with the arrival time of the imprint material 9 to the substrate edge. FIG. 11 is a diagram illustrating an example of a supply pattern for the imprint material in relation to the peripheral shot region, and illustrates an example in which the drop amount of droplets of the imprint material 9 is changed in accordance with the substrate edge. As the method of determining the supply pattern, the method described in the first embodiment can be used.

According to the present embodiment, even in the case of performing the imprint processing by tilting the mold 7 or in the case of performing the imprint processing on the peripheral shot region of the substrate 10, it is possible to reduce extrusion of the imprint material from the edge of the shot region and the mold being unfilled with imprint material.

In each of the embodiments described above, an imprint method according to a photocuring method and the imprint apparatus have been described. Even if the step of irradiating light for curing is changed into a step according to a heat-curing method in which heat is applied for curing, the operation and effect of the present invention are exactly the same. That is, the present invention can also be applied to an imprint apparatus employing a heat-curing method.

Fourth Embodiment

In the first to third embodiments described above, as one aspect of the forming apparatus, an imprint apparatus for transferring a pattern of the mold to the imprint material by bringing the imprint material and the mold into contact with each other has been described. However, the present invention can also be applied to a planarization apparatus in which a planarized film of a composition is formed on a substrate by bringing a composition on the substrate and a member (mold) having a flat surface into contact, as another embodiment of a forming apparatus.

The underlying pattern on the substrate has an uneven profile caused by the pattern formed in the previous step, and in particular, in conjunction with multilayering of memory elements in recent years, some process substrates have a step difference of about 100 nm. A step caused by the gentle waviness of the entire substrate can be corrected by a function for focus tracking a scanning exposure apparatus used in a photolithographic step. However, irregularities with fine pitches that fall within an area of an exposure slit of the exposure apparatus may deviate from the DOF (Depth Of Focus) of the exposure apparatus. Conventionally, as a method of smoothing an underlying pattern of a substrate, a method of forming planarization layers such as SOC (Spin On Carbon) and CMP (Chemical Mechanical Polishing) has been used. However, there is a problem in that sufficient planarization performance cannot be achieved in the prior art, and the unevenness difference of the base due to multilayering will tend to increase further into the future.

In order to solve this problem, a planarization apparatus for planarizing a substrate using the imprint technique as described above is being studied. The planarization apparatus performs local planarization in the substrate surface by bringing a flat surface of a member or a member (planar template) on which a pattern is not formed into contact with an uncured composition (planarizing material) previously supplied to the substrate. The composition is then cured in a state in which the composition and the planar template are in contact, and the planar template is separated from the cured composition. As a result, a planarization layer is formed on the substrate. Since the planarization apparatus using an imprint technique drops the composition in an amount corresponding to the level difference of the substrate, it is expected that the accuracy of planarization will be improved as compared with the existing method.

In the case of the planarization apparatus, a planarized film is collectively formed on the entire surface of the substrate. In this case, the above embodiment can be applied to reduce the extrusion of the composition from the substrate and the mold being unfilled by the composition.

Embodiments of an Article Manufacturing Method

The pattern of the cured product formed using the imprint apparatus is used permanently on at least a part of the various articles or temporarily in manufacturing the various articles. The article may be an electric circuit element, an optical element, a MEMS, a recording element, a sensor, a mold, or the like. Examples of the electric circuit element include a volatile or nonvolatile semiconductor memory such as a DRAM, SRAM, a flash memory, and a MRAM, and semiconductor elements such as LSIs, CCDs, image sensors, and FPGA. The mold may be an imprint mold or the like.

The pattern of the cured product may be used as it is as a constituent member of at least a part of the aforementioned article, or may be temporarily used as a resist mask. After etching, ion implantation, or the like is performed in the substrate processing step, the resist mask is removed.

Next, the article manufacturing method will be described. In step SA of FIG. 12, a substrate $1z$ such as a silicon substrate having a surface on which a processed material $2z$ such as an insulator is formed is prepared, and subsequently, an imprint material $3z$ is applied to the surface of the processed material $2z$ by an ink-jet method or the like. Here, an imprint material $3z$ in the form of a plurality of droplets is applied onto a substrate.

Figure 12:
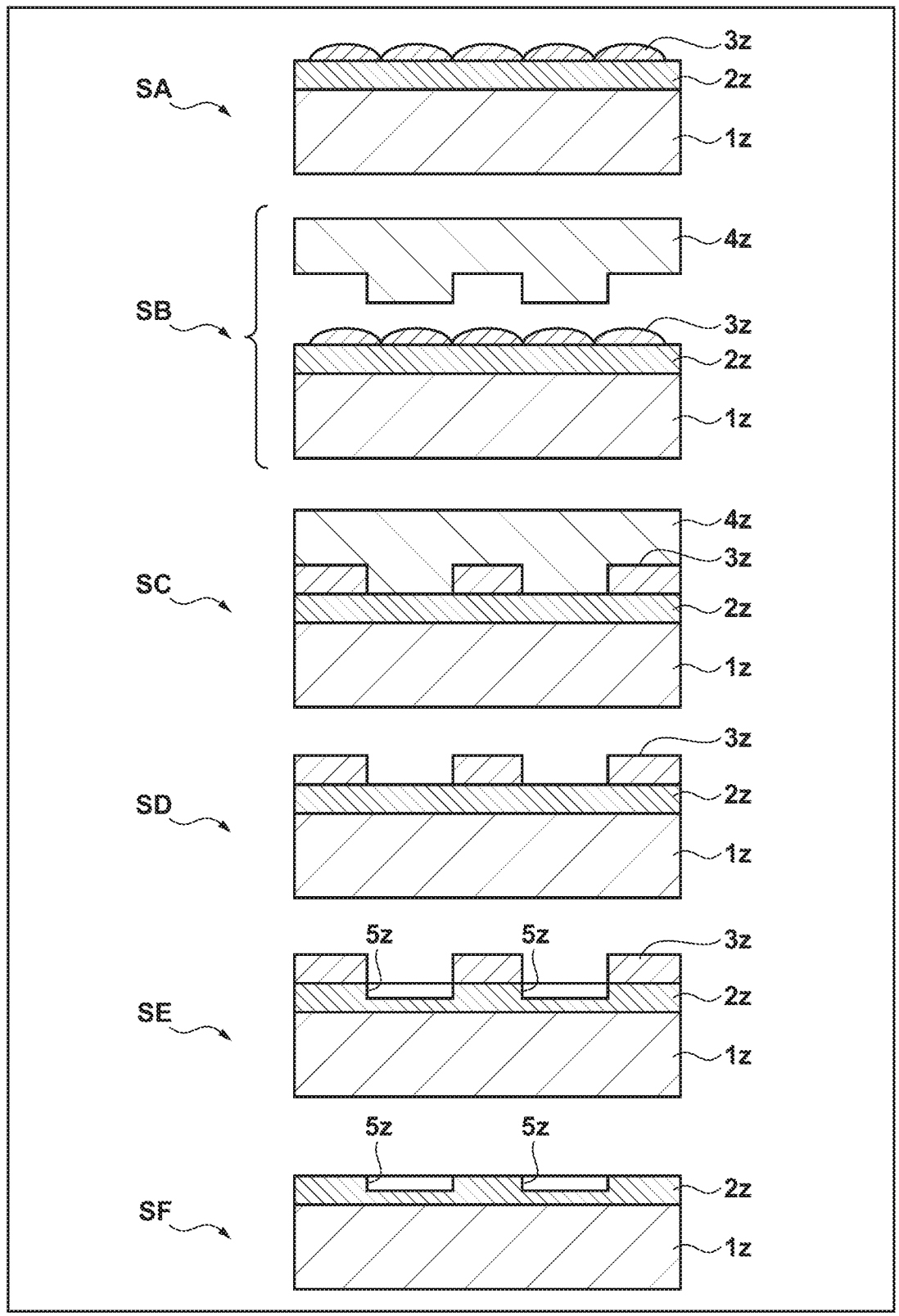
FIG. 12 is a view for describing an article manufacturing method in an embodiment.

In step SB of FIG. 12, the side of the mold $4z$ for imprinting on which the concavo-convex pattern is formed is opposite the imprint material $3z$ on the substrate. In step SC of FIG. 12, the substrate $1z$ to which the imprint material $3z$ has been applied and the mold $4z$ are brought into contact, and the pressure is applied. The imprint material $3z$ fills the gaps between the mold $4z$ and the processed material $2z$. In this state, when light is irradiated as curing energy through the mold $4z$, the imprint material $3z$ is cured.

In step SD of FIG. 12, when the mold $4z$ and the substrate $1z$ are separated after curing the imprint material $3z$, patterns of a cured product of the imprint material $3z$ are formed on the substrate $1z$. In the pattern of the cured product, the concave portion of the mold corresponds to the convex portion of the cured product, and the convex portion of the mold corresponds to the concave portion of the cured product, that is, the concave-convex pattern of the mold $4z$ is transferred onto the imprint material $3z$.

In the step SE of FIG. 12, when etching is performed using the cured product pattern as an etching resistant mask, portions of the surfaces of the processed material $2z$ where there is no cured product or that remain thin are removed, resulting in a trench $5z$. In step SF of FIG. 12, when the patterns of the cured product are removed, an article in which the trench $5z$ is formed on the surface of the processed material $2z$ can be obtained. Although the pattern of the cured product is removed here, it may be used as a film for interlayer insulation included in a semiconductor element or the like, that is, a constituent member of an article, for example, without being removed even after processing.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-083209, filed Apr. 24, 2019, which is hereby incorporated by reference herein in its entirety.

What is claimed is:

1. A forming apparatus comprising:
   a supplier configured to discretely supply droplets of a composition onto a shot region of a substrate; and
   a controller configured to control the supplier in accordance with a supply pattern that indicates at least one of a drop amount or a drop position of each droplet,
   wherein the shot region has a rectangular outer shape, and
   wherein the controller is configured to determine the supply pattern such that a minimum distance between adjacent droplets supplied onto the shot region by the supplier gradually decreases from a center of each side of the rectangular outer shape of the shot region toward both corners of the each side of the rectangular outer shape of the shot region.

2. The forming apparatus according to claim 1, wherein the minimum distance is reduced by increasing a drop amount per droplet.

3. The forming apparatus according to claim 1, wherein the minimum distance is reduced by reducing a center-to-center distance between the adjacent droplets.

4. The forming apparatus according to claim 1, wherein the controller is configured to
   i) calculate a time from when contact between a composition of a provisional supply pattern in a shot region and a mold is started until when the composition spreads to arrive at an edge of the shot region, and
   ii) determine the supply pattern by adjusting the provisional supply pattern based on the calculated time.

5. The forming apparatus according to claim 4, wherein the controller is configured to
   i) reduce a difference between
      a) a time from when contact between the composition of the provisional supply pattern in the shot region and the mold is started until when a first portion of the composition by spreading first arrives at the edge of the shot region and
      b) a time when a second portion of the composition last arrives at the edge of the shot region, and
   ii) determine the supply pattern by adjusting the provisional supply pattern.

6. The forming apparatus according to claim 1, wherein the forming apparatus is an imprint apparatus operable to transfer a pattern of a mold to an imprint material which is the composition on the substrate by bringing the imprint material and the mold into contact.

7. The forming apparatus according to claim 1, wherein the forming apparatus is a planarization apparatus operable to form a planarized film by the composition on the substrate by bringing the composition on the substrate and a flat surface of a mold into contact.

8. A method for determining a supply pattern indicating at least one of a drop amount or a drop position for each droplet of a composition to be used in a forming process that includes a supplying step of discretely supplying droplets of the composition onto a shot region of a substrate via a supplier; a contacting step of bringing the composition supplied onto the substrate and a mold into contact; a curing step of curing the composition in a state in which the composition and the mold are in contact; and a separating step of separating the composition and the mold after curing, wherein the shot region has a rectangular outer shape, the method comprising:
   a determination step of determining the supply pattern via a controller such that a minimum distance between adjacent droplets supplied onto the shot region by the supplier gradually decreases from a center of each side of the rectangular outer shape of the shot region toward both corners of the each side of the rectangular outer shape of the shot region,
   wherein the determination step comprises:
   in a case of executing the contacting step after executing the supplying step to a shot region of the substrate in accordance with an initial supply pattern, predicting a time at which the composition will arrive at an edge of the shot region in the contacting; and
   based on the predicted time, so as to reduce a difference between a time when the composition first arrives at an edge of the shot region and a time when the composition last arrives at the edge of the shot region in the contacting, determining the supply pattern by adjusting the initial supply pattern.

9. A method for manufacturing an article, the method comprising:
   forming a pattern onto a substrate using an imprint apparatus configured to, in a state in which a composition on the substrate and a mold have been brought into contact, cure the composition to thereby mold the composition, the imprint apparatus including:
      a supplier configured to discretely supply droplets of the composition onto a shot region of the substrate; and
      a controller configured to control the supplier in accordance with a supply pattern that indicates at least one of a drop amount or a drop position of each droplet,
      wherein the shot region has a rectangular outer shape,
      wherein the controller is configured to determine the supply pattern such that a minimum distance between adjacent droplets supplied onto the shot region by the supplier gradually decreases from a center of each side of the rectangular outer shape of the shot region toward both corners of the each side of the rectangular outer shape of the shot region, and
      wherein the imprint apparatus is operable to transfer a pattern of the mold to an imprint material which is the composition on the substrate by bringing the imprint material and the mold into contact; and
   processing the substrate on which the pattern is formed in the forming;
   wherein the article is manufactured from the substrate processed in the processing.

10. A method for method for manufacturing an article, the method comprising:
   forming a film on a substrate by using a planarization apparatus configured to, in a state in which a composition on the substrate and a mold have been brought into contact, cure the composition to thereby mold the composition, the planarization apparatus including:
      a supplier configured to discretely supply droplets of the composition onto a shot region of the substrate; and
      a controller configured to control the supplier in accordance with a supply pattern that indicates a drop amount and a drop position of each droplet,
      wherein the shot region has a rectangular outer shape,
      wherein the controller is configured to determine the supply pattern such that a minimum distance between adjacent droplets supplied onto the shot region by the supplier gradually decreases from a center of each side of the rectangular outer shape of the shot region toward both corners of the each side of the rectangular outer shape of the shot region, and
      wherein the planarization apparatus is operable to form the film by bringing the composition on the substrate and a flat surface of the mold into contact; and
   processing the film formed in the forming,
   wherein the article is manufactured from the substrate processed in the processing.

* * * * *